United States Patent
Choi et al.

(10) Patent No.: US 7,332,433 B2
(45) Date of Patent: Feb. 19, 2008

(54) METHODS OF MODULATING THE WORK FUNCTIONS OF FILM LAYERS

(75) Inventors: Kisik Choi, Austin, TX (US); Husam Alshareef, Austin, TX (US); Prashant Majhi, Austin, TX (US)

(73) Assignee: Sematech Inc., Austin, TX (US)

(*) Notice: Subject to any disclaimer, the term of this patent is extended or adjusted under 35 U.S.C. 154(b) by 6 days.

(21) Appl. No.: 11/233,356

(22) Filed: Sep. 22, 2005

(65) Prior Publication Data
US 2007/0063296 A1   Mar. 22, 2007

(51) Int. Cl.
H01R 24/00 (2006.01)

(52) U.S. Cl. ............... 438/685; 438/154; 438/587; 438/588; 438/591; 257/202; 257/288; 257/412; 257/750; 257/E21.021; 257/E21.632; 257/E21.637; 257/E27.046; 257/E27.108

(58) Field of Classification Search ........... 257/202, 257/288, 412, 750, E21.021, E21.632, E27.046, 257/E27.108; 438/154, 585, 587, 588, 591
See application file for complete search history.

(56) References Cited

U.S. PATENT DOCUMENTS

| | | | |
|---|---|---|---|
| 6,291,282 B1 | 9/2001 | Wilk et al. | 438/203 |
| 6,410,376 B1 | 6/2002 | Ng et al. | 438/199 |
| 6,444,512 B1 | 9/2002 | Madhukar et al. | 438/203 |
| 6,514,827 B2 | 2/2003 | Kim et al. | 438/292 |
| 6,545,324 B2 | 4/2003 | Madhukar et al. | 257/371 |
| 6,573,134 B2 | 6/2003 | Ma et al. | 438/216 |
| 6,586,288 B2 | 7/2003 | Kim et al. | 438/183 |
| 6,645,818 B1 | 11/2003 | Sing et al. | 438/275 |
| 6,653,698 B2 | 11/2003 | Lee et al. | 257/407 |
| 6,790,719 B1 | 9/2004 | Adetutu et al. | 438/195 |
| 6,794,234 B2* | 9/2004 | Polishchuk et al. | 438/199 |
| 6,794,281 B2 | 9/2004 | Madhukar et al. | 438/592 |
| 6,858,524 B2 | 2/2005 | Haukka et al. | 438/585 |
| 6,869,889 B1 | 3/2005 | Brask et al. | 438/746 |

(Continued)

FOREIGN PATENT DOCUMENTS

WO    WO 2004/019394    3/2004

(Continued)

OTHER PUBLICATIONS

J. Pan et al., "The effect of annealing temperatures on self-aligned replacement (damascene) TaCN-TaN-stacked gate pMOSFETs," IEEE Tansaction on Electron Device, vol. 51, No. 4, Apr. 2004, pp. 581-586.*

Primary Examiner—Lynne Gurley
Assistant Examiner—Meiya Li
(74) Attorney, Agent, or Firm—Fulbright & Jaworski (57) ABSTRACT

Methods for fabricating two metal gate stacks with varying work functions for complementary metal oxide semiconductor (CMOS) devices are provided A first metal layer may be deposited onto a gate dielectric, followed by the deposition of a second metal layer, where the second metal layer modulated the work function of the first metal layer. The second metal layer and subsequently etch, exposing a portion of the first metal layer. A third metal layer may be deposited on the etched second metal layer and the exposed first metal layer, where the third metal layer may modulate the work function of the exposed first metal layer. Subsequent fabrication techniques may be used to define the gate stack.

10 Claims, 3 Drawing Sheets

U.S. PATENT DOCUMENTS

| | | | |
|---|---|---|---|
| 6,894,353 B2 | 5/2005 | Samavedam et al. | 257/365 |
| 6,902,969 B2 | 6/2005 | Adetutu et al. | 438/199 |
| 6,908,801 B2 | 6/2005 | Saito | 438/199 |
| 2002/0058374 A1 | 5/2002 | Kim et al. | 438/228 |
| 2002/0086445 A1 | 7/2002 | Kim et al. | 438/1 |
| 2002/0140036 A1 | 10/2002 | Ma et al. | 257/351 |
| 2003/0119292 A1 | 6/2003 | Lee et al. | 438/596 |
| 2003/0143825 A1 | 7/2003 | Matsuo et al. | 438/585 |
| 2004/0023478 A1 | 2/2004 | Samavedam et al. | 438/592 |
| 2004/0036129 A1 | 2/2004 | Forbes et al. | 257/407 |
| 2004/0106249 A1 | 6/2004 | Huotari | 438/216 |
| 2004/0180487 A1* | 9/2004 | Eppich et al. | 438/199 |
| 2004/0191974 A1 | 9/2004 | Gilmer et al. | 438/199 |
| 2004/0222474 A1 | 11/2004 | Chau et al. | 257/369 |
| 2004/0245578 A1 | 12/2004 | Park et al. | 257/369 |
| 2004/0256679 A1 | 12/2004 | Hu | 257/371 |
| 2005/0026345 A1* | 2/2005 | Adetutu et al. | 438/199 |
| 2005/0032342 A1 | 2/2005 | Forbes et al. | 438/587 |
| 2005/0048722 A1* | 3/2005 | Saito et al. | 438/275 |
| 2005/0064653 A1* | 3/2005 | Park et al. | 438/232 |
| 2005/0064663 A1 | 3/2005 | Saito | 438/275 |
| 2005/0101113 A1 | 5/2005 | Brask et al. | 438/585 |
| 2005/0101145 A1* | 5/2005 | Visokay et al. | 438/706 |
| 2005/0158974 A1 | 7/2005 | Chau et al. | 438/592 |
| 2005/0167762 A1 | 8/2005 | Kadoshima et al. | 257/392 |
| 2005/0258468 A1* | 11/2005 | Colombo et al. | 257/314 |
| 2006/0068575 A1* | 3/2006 | Gluschenkov et al. | 438/585 |
| 2006/0115940 A1* | 6/2006 | Kim et al. | 438/197 |
| 2006/0234433 A1* | 10/2006 | Luan et al. | 438/197 |
| 2007/0018259 A1* | 1/2007 | Ko et al. | 257/410 |

FOREIGN PATENT DOCUMENTS

| | | |
|---|---|---|
| WO | WO 2004/093182 | 10/2004 |
| WO | WO 2004/095572 | 11/2004 |
| WO | WO 2004/105138 | 12/2004 |
| WO | WO 2005/045887 | 5/2005 |
| WO | WO 2005/048334 | 5/2005 |

* cited by examiner

METHODS OF MODULATING THE WORK FUNCTIONS OF FILM LAYERS

BACKGROUND OF THE INVENTION

1. Field of the Invention

The present invention relates generally to semiconductor fabrication, and more particularly to a method for fabricating dual metal gate complementary metal oxide semiconductor (CMOS) devices.

2. Description of Related Art

Semiconductor devices are continuously improved to enhance device performance. For example, smaller device sizes allow for the ability to construct smaller gate structures for complementary metal oxide semiconductor (CMOS) transistors such that more transistors are fitted on the same surface area, improving the switching speed of the transistor among other benefits. With CMOS technology scaling to approximately 45 nanometers or less, the conventional polysilicon dioxide gate stack is reaching its scaling limitation. Issues such as power, dissipation, and tunneling become more prevalent when the vertical dimension is reduced, e.g., decreasing the thickness of the poly-$SiO_2$ gate dielectric.

One alternative to the poly-$SiO_2$ gate stack is a metal gate, particularly a dual metal gate stack. Dual metal gate stacks generally require two separate metals, one metal over the NMOS active area and the other over the PMOS active region. These two metals may be selected based on their work function and ease of integration during wet and/or dry etch processes.

A conventional method for integrating dual metal gate CMOS includes depositing a first metal onto an NMOS and PMOS active region. The first metal layer may be an NMOS metal or PMOS metal depending on, for example, the ease of removal and selectivity without damaging the underlying gate dielectric. Usually, the NMOS metal (e.g., TaSiN, TiN, TaN, or the like) has a work function close to a silicon conduction band and exhibits more tendency of dissolution in common wet etch chemistries such as, but not limited to, scanning probe microscope (SPM) oxidation, SC1, or $H_2O_2$. PMOS metals (e.g., Ru, MO, W, Pt) have a work function similar to a silicon valence band and are more inert and difficult to etch in wet chemistries that are typically used in normal microelectronic fabrication. Thus, due to the ease of the etching process, NMOS metal is usually the first metal deposited and subsequently etched using known techniques in the art. Next, the second metal layer is deposited, generally on both the PMOS region and NMOS region.

As known in the art, due to the nature of the etching process, primarily for removing a metal layer without damaging the underlying gate dielectric, lithography process involves using a masking material to block an etching process over an area. For example, if an NMOS metal is first deposited, the masking material would allow for the metal to be removed from the PMOS area while blocking etching in the NMOS area.

One example of a masking layer is a photoresist layer. However, normal metal etch chemistry, particularly an NMOS metal etch chemistry including, without limitation, SPM, SC1, or $H_2O_2$, tends to also etch the photoresist layer at a high etch rate. The etching of the masking layer makes it difficult to preserve the metal layer on the active region, e.g., an NMOS metal on an NMOS region or a PMOS metal on a PMOS region.

Other materials such as oxides or nitrides have been used as masking material. In the case where an NMOS material is deposited as a first metal layer, both oxides and nitrides serving as a masking layer are not affected by the etching process, allowing the NMOS metal to be selectively removed in the PMOS region. However, prior to the deposition of the PMOS metal, the oxides or nitrides masking material needs to be removed. Typically, hydrofluoric (HF) acid can be used to remove an oxide masking layer; however, the HF acid can also damage the gate dielectric layer by etching it. Similarly, the removal of a nitride masking layer may cause similar damages to the gate dielectric. Damage to the gate dielectric may cause many problems including device failure, reduction in yield, and higher production cost.

Additionally, complications may arise from the simultaneous patterning of two gate stacks that are different of thickness and composition. For example, an NMOS gate stack may include two metal layers and a poly layer as compared to the PMOS gate stack which may include only one metal layer and a poly layer. Subsequent fabrication processes, such as an anneal process may cause the two metal layers in the NMOS gate stack to intermix. Any of the above complications may contribute to device failure and other issues.

Any shortcoming mentioned above is not intended to be exhaustive, but rather is among many that tends to impair the effectiveness of previously known techniques for fabricating a dual metal gate stack; however, shortcomings mentioned here are sufficient to demonstrate that the methodologies appearing in the art have not been satisfactory and that a significant need exists for the techniques described and claimed in this disclosure.

SUMMARY OF THE INVENTION

By replacing the poly gate electrodes with a dual work function metal gate electrode, issues such as polysilicon depletion can be reduced or substantially eliminated and inversion capacitance can be increased as compared to standard polysilicon/$SiO_2$ gate. Particularly, the present disclosure describes depositing a first metal layer and modulating its work function with the deposition of a second metal layer. The modulation is performed without exposing the high-k gate dielectric layer, reducing, and/or eliminating defects to the devices and simplifying the fabrication process.

In one respect, the present disclosure provides a method for fabricating a dual metal gate device. A first metal may be deposited on a gate dielectric on a substrate to form a first metal layer. The first metal layer may be selected from a group that includes, for example, titanium nitride, tantalum nitride, tantalum carbon nitride, and tungsten. Next, a second metal may be deposited on the first metal layer for forming the second metal layer and may modulate a work function of the first metal layer. The second metal layer may subsequently be etched to expose a portion of the first metal layer. A third metal may be deposited onto the second metal layer and the exposed first metal layer to form a third metal layer. In some embodiments, the third metal layer may also modulate the work function of the first metal layer. The first, second, and third metal layers may subsequently be etched to form a dual metal gate device.

In one embodiment, prior to the etching of the first, second, and third metal layers, the third metal layer may be etched to expose a portion of the second metal layer. The subsequent etching of the first, second, and third metal layers yields a device having a first gate stack including the first and second metal layers and a second gate stack including the first and third metal layers.

In other embodiments, the third metal layer includes the same material as the second metal layer. As such, the resultant gate stack may include a first gate stack including the first, second, and third metal layers and a second gate stack including the first and third metal layers.

In some respect, the first metal layer may include, for example, tantalum nitride, tantalum carbon nitride, and tungsten. The second metal layer may include, for example, titanium, hafnium nitride, and titanium silicon nitride. The third metal layer may include, for example, molybdenum nitride.

In other respects, a device may be provided. The device may include a substrate coupled to a gate dielectric layer. A first gate stack of the device may include a tantalum carbon nitride layer and a titanium layer. The second gate stack of the device may also include a tantalum carbon nitride layer. In some embodiments, the second gate stack may also include a titanium layer. The thickness of the titanium layer of the second gate stack may be different than the thickness of the titanium layer of the first gate stack. In other embodiments, the second gate stack may include a molybdenum nitride layer coupled to the tantalum carbon nitride layer.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The figures are examples only. They do not limit the scope of the invention.

DESCRIPTION OF ILLUSTRATIVE EMBODIMENTS

The disclosure and the various features and advantageous details are explained more fully with reference to the non-limiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The disclosure provides methods for creating a dual work function device by modulating a work function of a first metal layer using a second metal layer. Additionally, the disclosure provides methods for reducing or substantially eliminating defects to an underlying gate dielectric by avoiding metal wet etching on a first metal layer deposited onto the gate dielectric.

FIGS. 1A-F are cross-section views of a semiconductor device undergoing fabrication processes in accordance with certain embodiments of this disclosure. Substrate 10 may include an NMOS active region, a PMOS active region, insulator 5, and gate dielectric layer 20. In step 100 shown in FIG. 1A, a first metal may be deposited to form first metal layer on gate dielectric 20. In one embodiment, using an atomic layer deposition (ALD) technique, tantalum carbon nitride (TaCN) may be deposited onto gate dielectric layer 20 to form ALD TaCN film layer 30, as shown in step 100.

Figure 1:
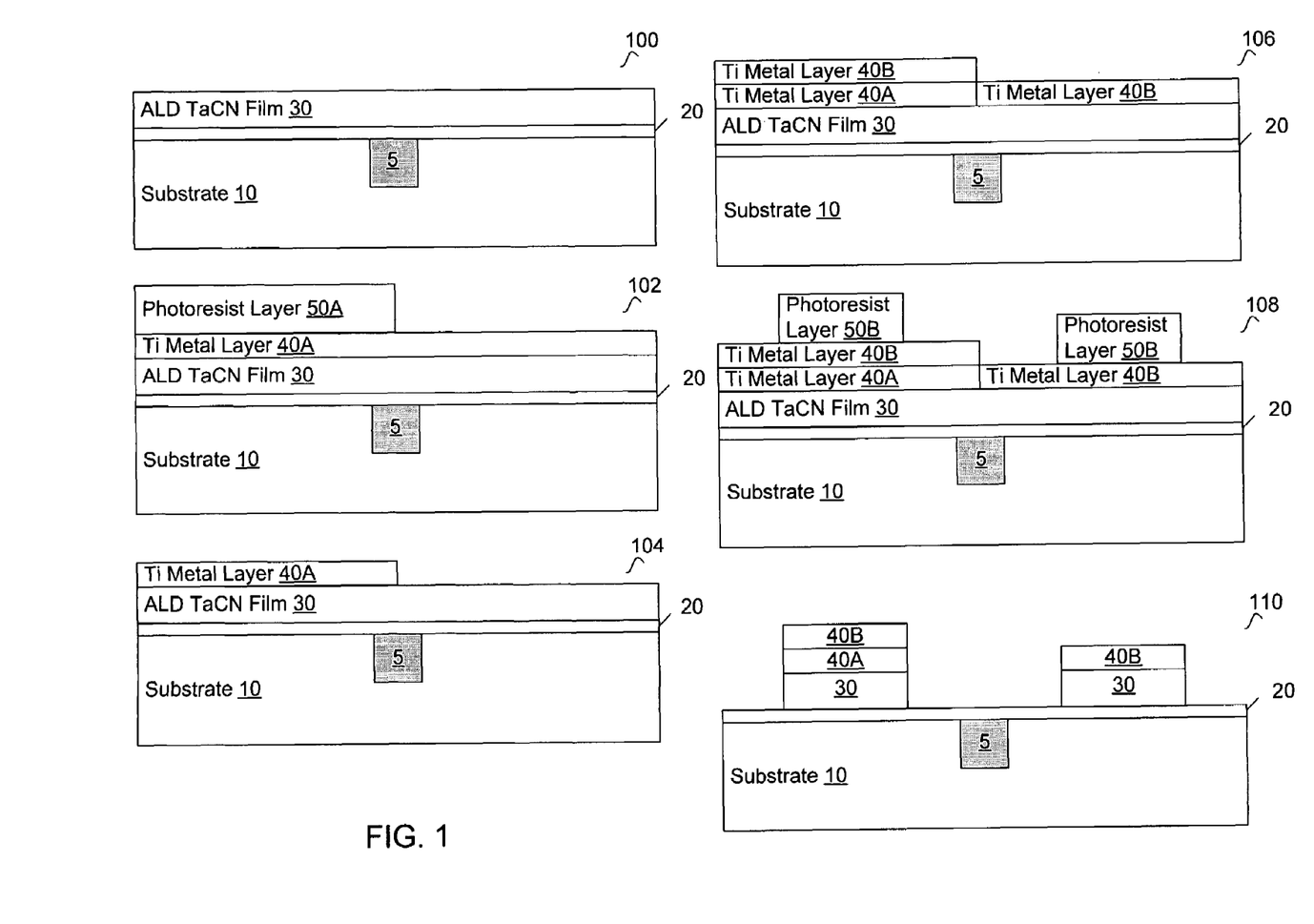
FIGS. 1A-F are cross-section views of a semiconductor device undergoing fabrication processes in accordance with certain embodiments of this disclosure.
Figure 1A:
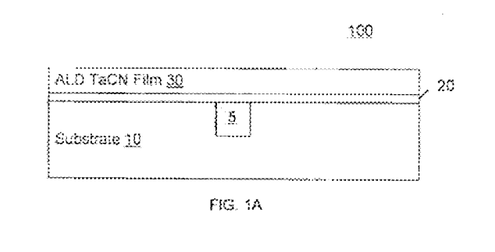
Figure 1B:
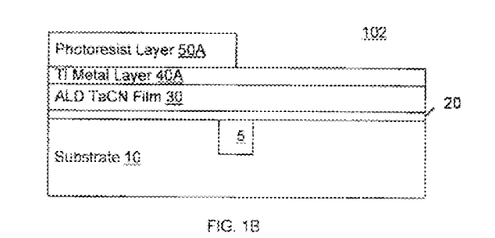

In step 102 shown in FIG. 1B, a second metal may be deposited on the first metal layer 30 to form a second metal layer. In one embodiment, titanium (Ti) may be deposited using a physical vapor deposition (PVD) technique to form titanium metal layer 40A. Photoresist layer 50A may be deposited on titanium metal layer 40A and patterned using techniques known in the art such that the photoresist layer defines an area over one active region of substrate 10, e.g., an NMOS active region or a PMOS active region.

Figure 1C:
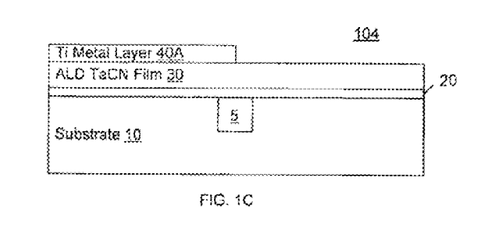

In step 104 shown in FIG. 1C, a portion of Ti metal layer 40A not protected by photoresist layer 50A may be removed, exposing a portion of ALD TaCN film layer 30. In one embodiment, Ti metal layer 40A may be etched using dry or wet etching techniques selective to TaCN film layer 30 known in the art. Photoresist layer 50A may subsequently be stripped from Ti metal layer 40A using techniques known in the art including, without limitations, liquid resist strippers or by oxidation.

Figure 1D:
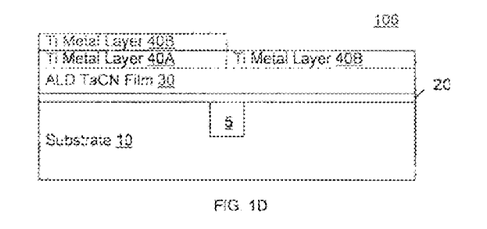
Figure 3:
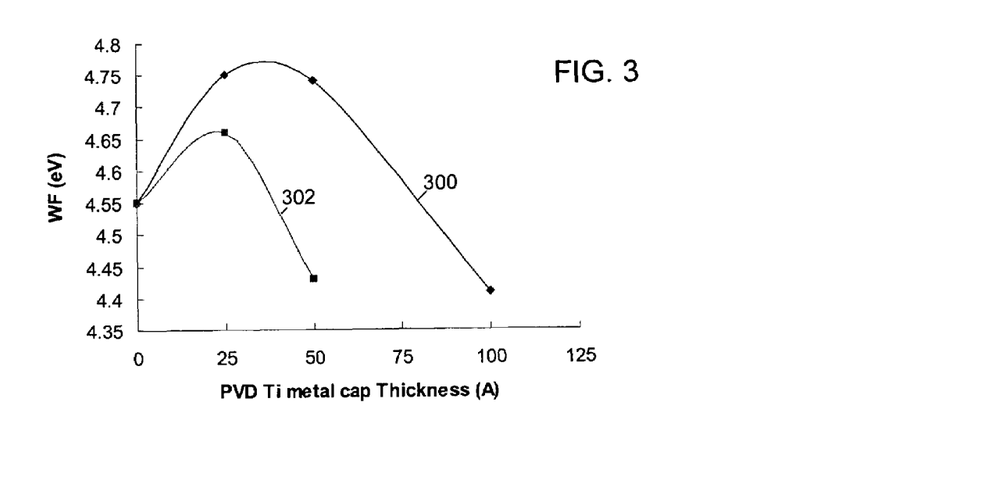
FIG. 3 is a graph showing the change in the work function of a first metal layer when titanium is deposited, in accordance with embodiments of this disclosure.

Next, a third metal may be deposited on the remaining Ti metal layer 40A and the exposed portion of ALD TaCN film 30 from step 104, as shown in step 106 of FIG. 1D. The third metal may be titanium and may form Ti metal layer 40B. The resultant structure from step 106 includes a varying thickness of the Ti metal layer over substrate 10. Particularly, the thickness of the Ti metal layer varies between the two active regions. By controlling the thickness of the Ti metal layer (40A and/or 40B), the work function of the ALD TaCN film 30 may be controlled. For example, referring to FIG. 3, plot line 300 shows the varying work functions of a TaCN layer with a thickness of 100 Angstroms with different thickness of a Ti layer. Similarly, plot line 302 shows the varying work function of a TaCN layer with a thickness of about 50 Angstroms. As seen in FIG. 3, nearly a range of about 400 meV can obtain by varying the thickness of the Ti layer.

Figure 1E:
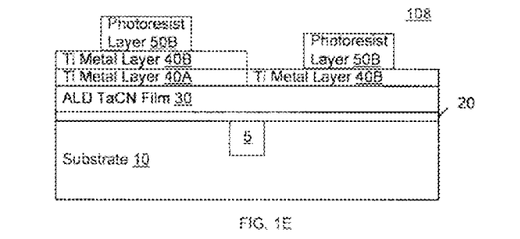

In step 108 shown in FIG. 1E, photoresist layer 50B may be deposited and patterned to form a separate layer over the NMOS and PMOS active region of substrate 10. In particular, photoresist layer 50B may define the dual metal gate areas. In one embodiment, Ti metal layers 40A and 40B may be etched using a dry or wet etch technique known in the art. An etchant selective to ALD TaCN film layer 30 may be used to etch Ti metal layers 40A and 40B. Next, ALD TaCN film layer 30 may be etched, forming two a dual-metal gate device, and in particular, a dual work function device. The photoresist layer 50B may subsequently be removed using techniques known in the art.

Figure 1F:
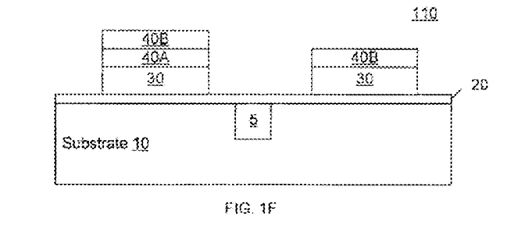

In one embodiment, the resultant structure shown in step 110 shown in FIG. 1F includes Ti metal layers 40A and 40B which may be approximately 10 nanometers thick. This results in a work function for the NMOS active region of approximately 4.4 eV. Ti metal layer 40B may be over the PMOS active region and may be approximately 2 nanometers thick. This allows for the work function in the PMOS active region to be approximately 4.75 eV. As shown, the thickness of the overlaying metal layers, particularly the Ti metal layer may be used to modify the work function of the metal gate stacks.

Alternatively, titanium nitride (TiN) may be deposited on gate dielectric 20 to form a first metal layer. Next, TaCN may be deposited onto the first metal layer to form a second metal layer. TaCN is a low density film that facilitates significant metal interdiffusion and thus, allows for work function modification. Upon etching the TaCN layer to expose a portion of the TiN layer (similar to step 104 of FIG. 1C), a third layer may be deposited on the TaCN layer and exposed TiN layer. In one embodiment, TaCN may be deposited to form the third layer. Subsequent fabrications may include steps similar to steps 106, 108, and 110. The resultant structure formed may include one active region of the substrate having a thicker second layer than the active region.

In other embodiments, tantalum nitride (TaN) may be deposited to form either a first or second metal layers combined with either a titanium or titanium nitride layer. Subsequent fabrication steps may be similar to steps 104, 106, and 108 of FIGS. 1C-E. The resultant structure may be similar to the one shown in step 110 of FIG. 1F.

Other metal layers can be used with the benefit of this disclosure. In one example, tungsten (W) may be deposited as a first metal layer and hafnium nitride (HfN) may be deposited using techniques known in the art, e.g., physical vapor deposition, similar to steps 100 and 102 of FIGS. 1A and B. Subsequent fabrication steps may be similar to steps 104, 106, and 108 of FIGS. 1C-E. The resultant structure may be similar to the one shown in step 110 of FIG. 1F. The deposition of HfN may alter the work function of the tungsten metal layer by 400 mV. Similarly, titanium silicon nitride (TiSiN) may be deposited on the tungsten metal layer and may also alter the work function of the tungsten metal layer by 400 mV.

FIGS. 2A-E are cross-section views of a semiconductor device undergoing alternative fabrication processes in accordance with other embodiments of this disclosure. In some embodiments, tantalum carbon nitride (TaCN) may be deposited on gate dielectric layer 20 of substrate 10 to form a first metal layer. In one embodiment, an ALD technique may be used to deposit TaCN onto substrate 10 to form ALD TaCN layer 31, as seen in step 200 of FIG. 2A. Next, a second metal may be deposited may be deposited on the first metal layer 31 to form a second metal layer. In one embodiment, titanium nitride (TiN) may be deposited using a chemical vapor deposition (CVD) technique to form titanium nitride metal layer 40, as seen in step 202 of FIG. 2B. Photoresist layer 50A may be deposited on titanium nitride metal layer 40 and patterned using techniques known in the art such that the photoresist layer defines an area over one active region of substrate 10, e.g., an NMOS active region or a PMOS active region (step 202).

Figure 2:
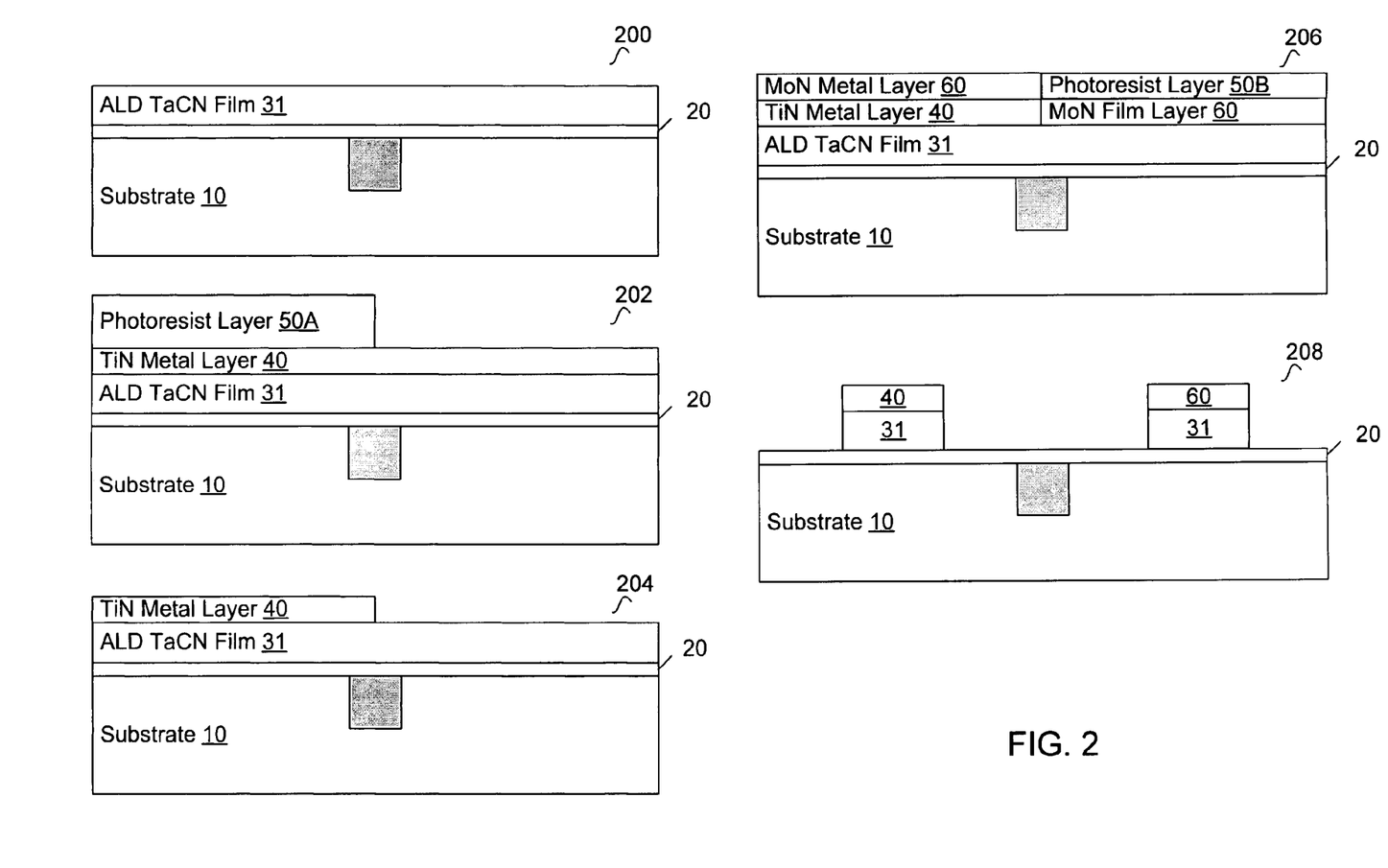
FIGS. 2A-E are cross-section views of a semiconductor device undergoing alternative fabrication processes in accordance with other embodiments of this disclosure.
Figure 2A:
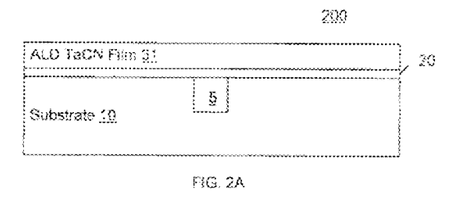
Figure 2B:
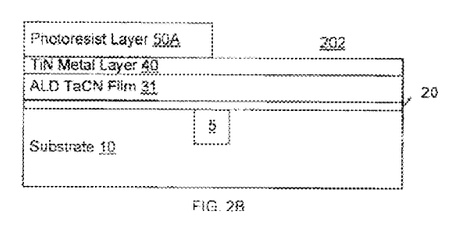
Figure 2C:
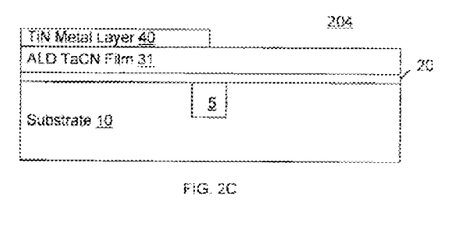

In step 204 of FIG. 2C, TiN metal layer 40 may be removed using techniques known in the art. For example, TiN metal layer 40 may be etched using a dry or wet etch process. An etchant, selective to first metal layer 31 may be used to remove a portion of TiN metal layer 40 and exposing a portion of first metal layer 31, as shown in FIG. 2. In particular, TiN metal layer 40 may be removed from NMOS active region of substrate 10.

Figure 2D:
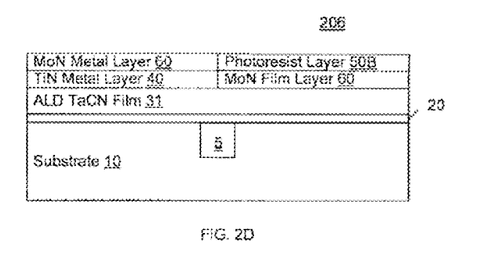

Next, a third metal may be deposited on etched TiN metal layer 40 and the exposed portion of first metal layer 31, as shown in step 206 of FIG. 2D. In one embodiment, molybdenum nitride (MoN) may be deposited to form MoN metal layer 60. Photoresist layer 50B may be deposited onto MoN metal layer 60 and patterned such that photoresist layer 50B protects one active area of substrate 10. In one embodiment, photoresist layer 50B may be patterned to protect the NMOS active region of substrate 10. A portion of MoN metal layer 60 may be removed using techniques known in the art, including, without limitation, wet and/or dry etch process using an etchant selective to TiN.

Figure 2E:
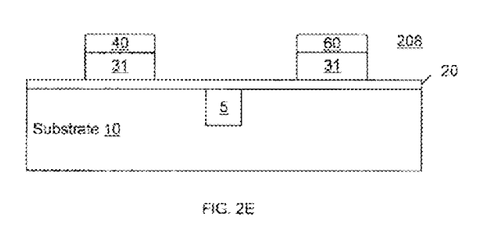

A dual metal gate device may be fabricated with subsequent etching steps, as shown in FIG. 2E. For example, during a gate stack etch process, an etchant may be used to etch the metal layers 40 and 60, respectively. The etching process may be selected such that the etching process stops on TaCN metal layer 31. Next, TaCN metal layer 31 may be etched to form the dual metal gate device.

Figure 4:
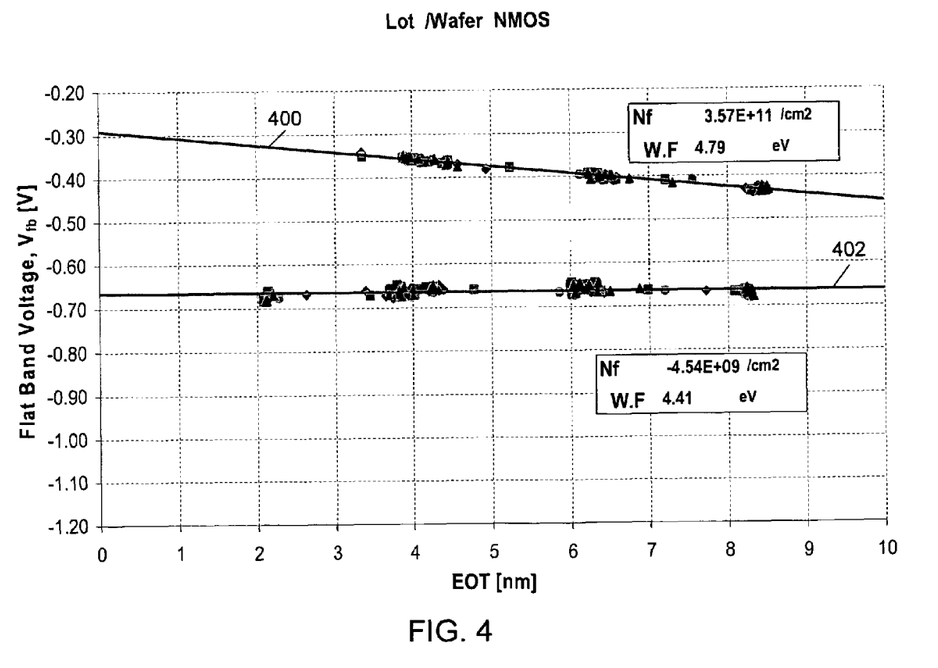
FIG. 4 is a graph showing the change in the work function of a first metal layer when different metal layers are deposited, in accordance with embodiments of this disclosure.

By using and manipulating the thickness of the overlaying metal layer, the effective work function of TaCN metal layer 31 may be altered. For example, FIG. 4 shows a graph showing the flat band voltages of different wafers at different effective oxide thickness (EOT). Particularly, plot line 400 illustrates the EOT for a plurality wafers that includes a TaCN layer and TiN layer having a thickness of about 200 Angstroms and plot line 402 illustrates the EOT for a plurality wafers that include a TaCN layer and a MoN layer having a thickness of about 50 Angstroms. As seen in FIG. 4, the effective work function difference between plot lines 400 and 402 is about 380 meV.

All of the methods disclosed and claimed can be made and executed without undue experimentation in light of the present disclosure. While the methods of this invention have been described in terms of embodiments, it will be apparent to those of skill in the art that variations may be applied to the methods and in the steps or in the sequence of steps of the method described herein without departing from the concept, spirit and scope of the invention. All such similar substitutes and modifications apparent to those skilled in the art are deemed to be within the spirit, scope, and concept of the disclosure as defined by the appended claims.

The invention claimed is:

1. A method for fabricating a dual metal gate device, comprising:
    providing a substrate;
    depositing a gate dielectric on the substrate;
    depositing a first metal on the gate dielectric to form a first metal layer, the first metal being selected from the group consisting of titanium nitride, tantalum nitride, tantalum carbon nitride, and tungsten;
    depositing a second metal on the first metal layer to form a second metal layer;
    etching the second metal layer to form an etched second metal layer and to expose a portion of the first metal layer;
    depositing a third metal layer on the exposed portion of the first metal layer and the etched second metal layer; and
    etching the first, second, and third metal layers to form the dual metal gate device; a first metal gate of the dual metal gate device comprising the first and third metal layers, and a second metal gate of the dual metal gate device comprising the first and second metal layers.

2. The method of claim 1, the second metal layer being selected from the group consisting of titanium nitride, tantalum carbon nitride, hafnium nitride, and titanium silicon nitride.

3. The method of claim 1, the third metal layer comprising the same material as the second metal layer.

4. The method of claim 1, further comprising, prior to etching the first, second, and third metal layers, etching the third metal layer to expose the etched second layer.

5. The method of claim 4, the third metal layer comprising molybdenum nitride.

6. A method for fabricating a dual metal gate device, the method comprising:
   providing a substrate;
   depositing a gate dielectric on the substrate;
   depositing a first nitride metal layer on the gate dielectric;
   depositing titanium nitride on the first nitride metal layer for forming a titanium nitride layer;
   etching the titanium nitride metal layer to form an etched titanium nitride metal layer and to expose a portion of the first nitride metal layer;
   depositing a nitride metal compound to form a second nitride metal layer on the exposed portion of the first nitride metal layer and the etched titanium nitride metal layer; and
   etching the nitride metal compound layer, the first nitride metal layer, and the etched titanium nitride metal layer to form the dual metal gate device; a first gate stack of the dual metal gate device comprising the nitride metal compound layer and the first nitride metal layer, and where second gate stack of the dual metal gate device comprising the first nitride metal layer and the titanium nitride metal layer.

7. The method of claim 6, the first nitride metal layer comprising tantalum nitride.

8. The method of claim 6, the first nitride metal layer comprising tantalum carbon nitride.

9. The method of claim 6, where the titanium nitride metal layer of the second gate stack is thicker than the first nitride metal layer the second gate stack.

10. The method of claim 6, the nitride metal compound layer comprising a molybdenum nitride metal layer.

* * * * *

UNITED STATES PATENT AND TRADEMARK OFFICE
CERTIFICATE OF CORRECTION

PATENT NO. : 7,332,433 B2
APPLICATION NO. : 11/233356
DATED : February 19, 2008
INVENTOR(S) : Kisik Choi et al.

It is certified that error appears in the above-identified patent and that said Letters Patent is hereby corrected as shown below:

Title Page and Col. 1
In title page, item (54), please delete title and insert --METHODS FOR MODULATING THE WORK FUNCTIONS OF FILM LAYERS-- therefor.

Drawings
Please replace drawings (sheets 1-3) with the replacement drawings submitted on July 9, 2007 and attached hereto.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,332,433 B2
APPLICATION NO. : 11/233356
DATED : February 19, 2008
INVENTOR(S) : Kisik Choi et al.

It is certified that error appears in the above-identified patent and that said Letters Patent is hereby corrected as shown below:

Delete the title page and substitute therefor the attached title page.

Title Page and Col. 1
In title page, item (54), please delete title and insert --METHODS FOR MODULATING THE WORK FUNCTIONS OF FILM LAYERS-- therefor.

Drawings
Please replace drawings (sheets 1-3) with the replacement drawings submitted on July 9, 2007 and attached hereto.

This certificate supersedes the Certificate of Correction issued September 23, 2008.

Signed and Sealed this

Fourteenth Day of October, 2008

JON W. DUDAS
*Director of the United States Patent and Trademark Office*

United States Patent
Choi et al.

(10) Patent No.: US 7,332,433 B2
(45) Date of Patent: Feb. 19, 2008

(54) METHODS FOR MODULATING THE WORK FUNCTIONS OF FILM LAYERS (75) Inventors: Kisik Choi, Austin, TX (US); Husam Alshareef, Austin, TX (US); Prashant Majhi, Austin, TX (US)

(73) Assignee: Sematech Inc., Austin, TX (US)

( * ) Notice: Subject to any disclaimer, the term of this patent is extended or adjusted under 35 U.S.C. 154(b) by 6 days.

(21) Appl. No.: 11/233,356

(22) Filed: Sep. 22, 2005

(65) Prior Publication Data
US 2007/0063296 A1    Mar. 22, 2007

(51) Int. Cl.
H01R 24/00    (2006.01)
(52) U.S. Cl. .......... 438/685; 438/154; 438/587; 438/588; 438/591; 257/202; 257/288; 257/412; 257/750; 257/E21.021; 257/E21.632; 257/E21.637; 257/E27.046; 257/E27.108
(58) Field of Classification Search .......... 257/202, 257/288, 412, 750, E21.021, E21.632, E27.046, 257/E27.108; 438/154, 585, 587, 588, 591
See application file for complete search history.

(56) References Cited

U.S. PATENT DOCUMENTS

| | | | |
|---|---|---|---|
| 6,291,282 B1 | 9/2001 | Wilk et al. | 438/203 |
| 6,410,376 B1 | 6/2002 | Ng et al. | 438/199 |
| 6,444,512 B1 | 9/2002 | Madhukar et al. | 438/203 |
| 6,514,827 B2 | 2/2003 | Kim et al. | 438/292 |
| 6,545,324 B2 | 4/2003 | Madhukar et al. | 257/371 |
| 6,573,134 B2 | 6/2003 | Ma et al. | 438/216 |
| 6,586,788 B2 | 7/2003 | Kim et al. | 438/183 |
| 6,645,818 B1 | 11/2003 | Sing et al. | 438/275 |
| 6,653,698 B2 | 11/2003 | Lee et al. | 257/407 |
| 6,790,719 B1 | 9/2004 | Adetutu et al. | 438/195 |
| 6,794,234 B2 * | 9/2004 | Polishchuk et al. | 438/199 |
| 6,794,281 B2 | 9/2004 | Madhukar et al. | 438/592 |
| 6,858,524 B2 | 2/2005 | Haukka et al. | 438/585 |
| 6,869,889 B1 | 3/2005 | Brask et al. | 438/746 |

(Continued)

FOREIGN PATENT DOCUMENTS

WO    WO 2004/019394    3/2004

(Continued)

OTHER PUBLICATIONS

J. Pan et al., "The effect of annealing temperatures on self-aligned replacement (damascene) TaCN-TaN-stacked gate pMOSFETs," IEEE Transaction on Electron Device, vol. 51, No. 4, Apr. 2004, pp. 581-586.*

Primary Examiner—Lynne Gurley
Assistant Examiner—Meiya Li
(74) Attorney, Agent, or Firm—Fulbright & Jaworski (57)    ABSTRACT

Methods for fabricating two metal gate stacks with varying work functions for complementary metal oxide semiconductor (CMOS) devices are provided. A first metal layer may be deposited onto a gate dielectric, followed by the deposition of a second metal layer, where the second metal layer modulated the work function of the first metal layer. The second metal layer and subsequently etch, exposing a portion of the first metal layer. A third metal layer may be deposited on the etched second metal layer and the exposed first metal layer, where the third metal layer may modulate the work function of the exposed first metal layer. Subsequent fabrication techniques may be used to define the gate stack.

10 Claims, 3 Drawing Sheets